United States Patent
Xu et al.

(10) Patent No.: US 8,426,288 B2
(45) Date of Patent: Apr. 23, 2013

(54) METHOD FOR IMPROVING CAPACITANCE UNIFORMITY IN A MIM DEVICE

(75) Inventors: Qiang Xu, Shanghai (CN); Wenguang Zhang, Shanghai (CN); Chunsheng Zheng, Shanghai (CN); Yuwen Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/339,406

(22) Filed: Dec. 29, 2011

(65) Prior Publication Data

US 2012/0322222 A1    Dec. 20, 2012

(30) Foreign Application Priority Data

Jun. 15, 2011  (CN) .......................... 2011 1 0160311

(51) Int. Cl.
  *H01L 21/02*  (2006.01)
(52) U.S. Cl.
  USPC ........... 438/393; 438/381; 438/396; 438/791; 257/E21.008

(58) Field of Classification Search .................. 438/396, 438/393, 381, 791, 239, 240; 257/E21.008
See application file for complete search history.

(56) References Cited

U.S. PATENT DOCUMENTS

| | | | | |
|---|---|---|---|---|
| 5,773,100 | A * | 6/1998 | Chang et al. | 427/579 |
| 5,783,492 | A * | 7/1998 | Higuchi et al. | 438/710 |
| 6,815,370 | B2 * | 11/2004 | Han et al. | 438/758 |
| 8,080,477 | B2 * | 12/2011 | Nodera et al. | 438/694 |
| 8,119,545 | B2 * | 2/2012 | Honda et al. | 438/792 |

* cited by examiner

*Primary Examiner* — Michael Trinh
(74) *Attorney, Agent, or Firm* — Renner, Otto, Boisselle & Sklar, LLP

(57) ABSTRACT

A method for improving capacitance uniformity in a MIM device, mainly for the purpose of improving uniformity of a thin film within the MIM device, includes eight steps in order and step S2-step S6 may be repeated for several times as needed. According to the method for improving capacitance uniformity in a MIM device of the present invention, a certain quantity of defects in the thin film are removed by means of several times of deposition/plasma processes based on the current PECVD, and uniformity of the deposited thin film is increased, thereby improving uniformity in wet etching rate of the thin film and further improving capacitance uniformity in the MIM device.

12 Claims, 2 Drawing Sheets

METHOD FOR IMPROVING CAPACITANCE UNIFORMITY IN A MIM DEVICE

CROSS REFERENCE TO RELATED APPLICATIONS

The present invention claims priority under 35 U.S.C. §119 to Chinese Patent Application No. 201110160311.0, filed on Jun. 15, 2011, the entire content of which is incorporated herein by reference.

FIELD OF THE INVENTION

The present invention relates to a technique for preparing a thin film in a semiconductor device, and more particularly to a method for improving capacitance uniformity in a MIM (Metal-Insulator-Metal) device, which improves uniformity of a thin film within the MIM device.

BACKGROUND OF THE INVENTION

With continuous advancement in the technology of semiconductor integrated circuits and continuous improvements in the performance of a semiconductor device, semiconductor devices also exhibit a trend of miniaturization. For example, a MIM capacitor within the device is an important component in an integrated circuit and has wide range of applications.

Among capacitors in the existing integrated circuits, the MIM capacitor has gradually become popular in radio frequency (RF) integrated circuits. A dielectric thin film deposited in MIM is mostly formed by PECVD (Plasma Enhanced Chemical Vapor Deposition), which is widely applied in fabricating a high-k silicon nitride thin film due to its low deposition temperature. In PECVD, the reaction gases comprising the precursor for Si element and the precursor for N element are usually ionized by means of microwave, RF or the like, and a high frequency power is introduced under certain temperature and pressure for inducing glow discharge to form plasma, so that a desired type of thin film is deposited on a wafer or substrate. Since the activity of plasma is used to promote the reaction, this kind of CVD (Chemical Vapor Deposition) is referred as PECVD.

The nature of a silicon nitride thin film directly determines the performance of a MIM capacitor, which thus poses relatively high requirements on the properties of the silicon nitride thin film. The wet etching rate of a thin film represents homogeneity of the deposited thin film. From the aspect of uniformity in the wet etching rate of thin films in the prior art, the high-k silicon nitride thin film prepared by PECVD has poor uniformity in the thin film. Therefore, it becomes difficult to further improve uniformity in the thin film based on the existing equipments.

In view of the above problems, the present invention is based on the insight that the thin film within the MIM device should have a better uniformity during deposition, in order to avoid different regions of the same thin film suffering from too large differences in etching rate, during the subsequent etching process of the thin film, due to uniformity in thickness of the thin film, i.e., to improve uniformity in the wet etching rate, and to increase capacitance uniformity of the resulting thin film within the MIM device. In addition the method of the present invention also removes some chemical defects during deposition of the thin film.

SUMMARY OF THE INVENTION

It is an object of the present invention to provide a method for improving uniformity in capacitance of a MIM device, which increases uniformity in capacitance of the deposited thin film by performing deposition/plasma processes for several times.

To achieve the above object, the technical solution adopted in the present invention comprises a method for improving capacitance uniformity of a MIM device, mainly for the purpose of increasing the uniformity of the thin film within the MIM device, wherein the method comprises:

step S1: loading a wafer into a reaction chamber, introducing into the reaction chamber a gas mixture comprising silane and ammonia for producing the thin film, and maintaining the pressure value in the reaction chamber at this time for a period of time;

step S2: introducing the gas mixture into the reaction chamber at different fluxes, introducing nitrogen into the reaction chamber, and maintaining the pressure value in the reaction chamber at this time to be stabilized for a period of time;

step S3: turning on a RF generator to start discharge to ionize or decompose the reaction gas in the gas mixture, so that a thin film of silicon nitride is formed on the surface of wafer by chemical vapor deposition;

step S4: turning off the RF generator, stopping the introduction of the gas mixture into the reaction chamber, introducing argon and nitrogen into the reaction chamber at the same time, changing the pressure value in the reaction chamber at this time, and maintaining the pressure value in the reaction chamber at this time to be stabilized for a period of time to remove silane and ammonia remaining in the reaction chamber;

step S5: continuing to introduce argon and nitrogen into the reaction chamber, keeping the pressure value in the reaction chamber constant, and turning on the RF generator for passivating the deposited thin film of silicon nitride so that it has a stable chemical property;

step S6: continuing to introduce argon and nitrogen into the reaction chamber, and keeping the pressure value in the reaction chamber constant to remove silane and ammonia remaining in the reaction chamber;

step S7: moving the wafer away from the showerhead for gas sources, stopping the introduction of argon, continuing to introduce nitrogen into the reaction chamber, keeping the pressure value in the reaction chamber constant, and maintaining this state for a period of time;

step S8: vacuating the reaction chamber with a vacuum pump, so that the by-products in the depositing reaction are pumped out along with the mainstream gases.

In the method described above, in step S1-step S6, the wafer is placed at a position where its upper surface is 0.3 inch from the showerhead for gas sources, and in step S7-step S8, the wafer is pushed upward and moved away from the showerhead for gas sources.

In the method described above, in step S1, the fluxes of silane and ammonia are 100 sccm, respectively, the flux of nitrogen is 2000 sccm, the pressure in the reaction chamber is maintained at 8 Torr, and this state is stablized for 10 sec.

In the method described above, in step S2, silane and ammonia are introduced into the reaction chamber at fluxes of 40 sccm, 900 sccm, respectively, nitrogen is introduced into the reaction chamber a flux of 1000 sccm, the pressure in the reaction chamber is maintained at 8 Torr, and this state is stablized for 30 sec.

In the method described above, in step S3, the glow discharge power of the RF generator is 75 W, the discharge continues for 3 sec, and the deposition time for the thin film of silicon nitride is 3 sec.

In the method described above, in step S4, argon and nitrogen are introduced into the reaction chamber at a flux of 10000 sccm, respectively.

In the method described above, in step S4, the pressure in the reaction chamber is maintained at 6 Torr to remove silane and ammonia remaining in the reaction chamber, and the time for removing is 30 sec.

In the method described above, in step S5, introductions of argon and nitrogen into the reaction chamber are continued at a flux of 10000 sccm, respectively, so that the pressure in the reaction chamber is controlled at 6 Torr, the RF generator is turned on with a power of 50 W for 10 sec, and the time for passivating the thin film of silicon nitride is 10 sec.

In the method described above, in step S6, introductions of argon and nitrogen into the reaction chamber are continued at a flux of 10000 sccm, respectively, the pressure in the reaction chamber is maintained at 6 Torr to remove silane and ammonia remaining in the reaction chamber, and the time for removing is 5 sec.

In the method described above, in step S7, introduction of nitrogen into the reaction chamber is continued at a flux of 10000 sccm after closing argon, the pressure in the reaction chamber is maintained at 6 Torr, and this state is maintained for 5 sec.

In the method described above, in step S8, the reaction chamber is vacuated with a vacuum pump for 10 sec.

In the method described above, the method further comprises, before step S7 is performed, repeating step S2-step S6 for several times.

According to the method for improving capacitance uniformity in the MIM device of the present invention, a certain quantity of defects in the thin film are removed by means of several times of deposition/plasma processes based on the current PECVD, and uniformity of the deposited thin film is increased, thereby improving uniformity in wet etching rate of the thin film and further improving capacitance uniformity in the MIM device.

DETAILED DESCRIPTION OF THE EMBODIMENTS

The present invention will further be described in details hereinafter with reference to the accompanying drawings.

In an optional embodiment, for example based on the current PECVD for producing a thin film of silicon nitride, specific embodiments of the present invention are set forth by way of example.

Figure 1:
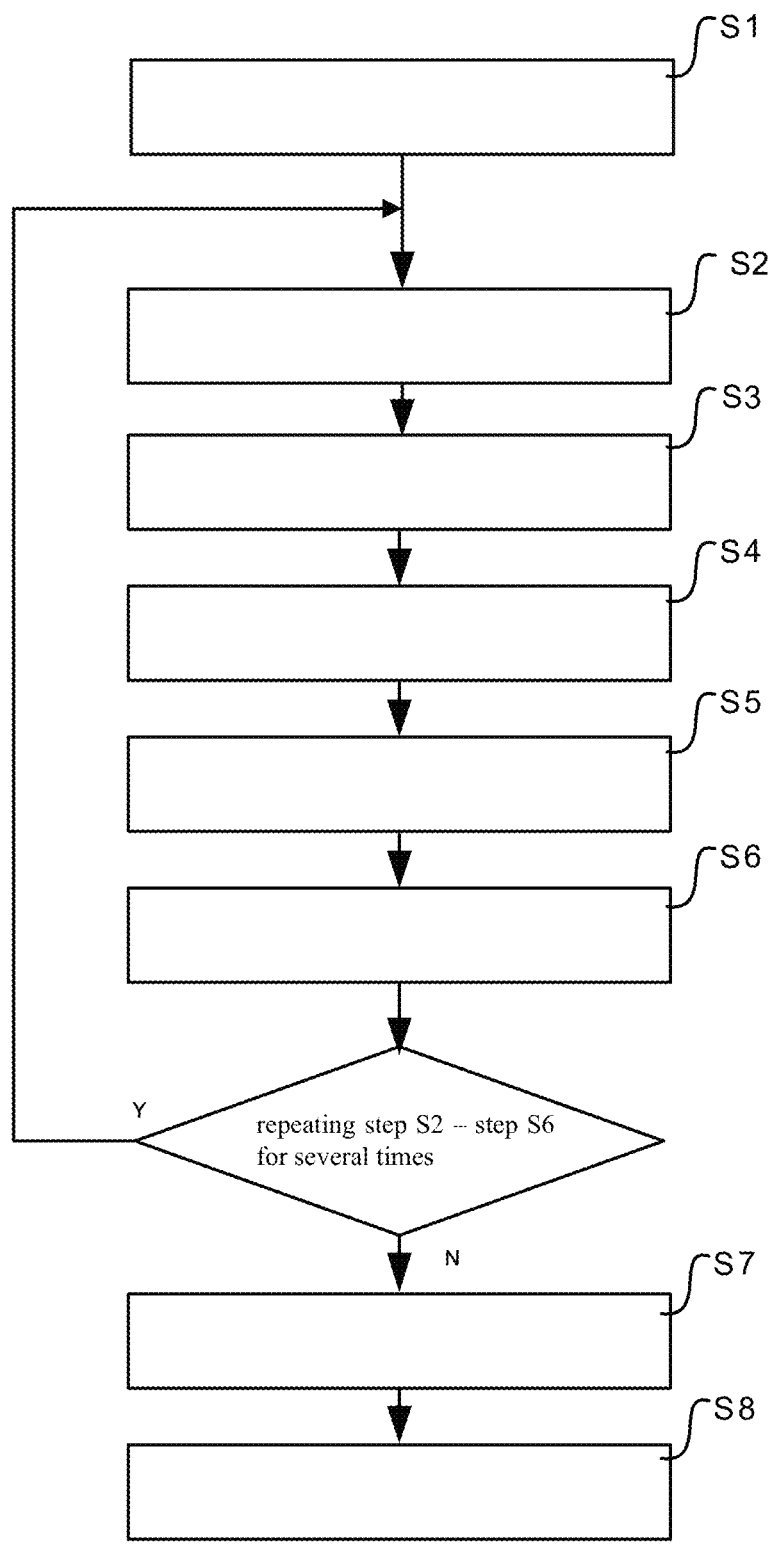
FIG. 1 is a flow chart showing a method for improving capacitance uniformity in a MIM device according to the present invention.

As shown in FIG. 1, the method for improving uniformity in capacitance of a MIM device of the present invention mainly serves to increase the uniformity of a thin film within the MIM device, so that during the subsequent etching (e.g. wet etching) process of the thin film, it is ensured that various regions across the thin film can have basically the same etching rate. Here, in a preferred embodiment, the method provided by the present invention mainly comprises the following steps, while some necessary steps of PECVD or the common techniques in the art will not be described in details in this application.

A wafer (or substrate) is loaded into a reaction chamber (a reaction chamber of a PECVD apparatus) for depositing a thin film on the surface of the wafer. A gas mixture comprising silane and ammonia for producing the thin film is introduced into the reaction chamber, and the pressure value in the reaction chamber at this time is maintained stable for a period of time. Here, in this step, the wafer is placed at a position where its upper surface is 0.3 inch from the bottom of a showerhead for gas sources in the reaction chamber. The reaction gases, i.e., silane ($SiH_4$) and ammonia ($NH_3$), are introduced into the reaction chamber at a flux of 100 sccm respectively, and the flux of nitrogen ($N_2$) is 2000 sccm. During this process, the throttle valve is partially opened. For example, the throttle valve is selected and opened with a valve value of about 24, in order to regulate the pressure inside the reaction chamber and maintain the pressure at 8 Torr. This state is maintained for 10 sec to stabilize the reaction chamber.

The gas mixture (comprising silane and ammonia) is introduced into the reaction chamber at different fluxes, and nitrogen is introduced into the reaction chamber at the same time. The pressure value in the reaction chamber remains stable for a period of time. Here, in this step, it is required to change the fluxes of silane and ammonia which are introduced into the reaction chamber, and to introduce nitrogen into the reaction chamber at the same time. The fluxes of silane, ammonia, and nitrogen are 40 sccm, 900 sccm, 1000 sccm, respectively. At this time, it is required to control the pressure in the reaction chamber to maintain at 8 Torr, and to stabilize at this state for 30 sec, in order to get ready for deposition of the thin film of silicon nitride in the subsequent step S3. In this step, a high-purity nitrogen ($N_2$) is used as the carrier gas, which dilutes the reaction gas of silane ($SiH_4$) and ammonia ($NH_3$), and also regulates the pressure in the reaction chamber. The fluxes of nitrogen (N2), silane ($SiH_4$), and ammonia ($NH_3$) can be controlled by flow meters.

A RF generator is turned on to start a discharge, which ionizes or decomposes the reaction gases in the gas mixture, so that a thin film of silicon nitride is formed on the surface of wafer by chemical vapor deposition. The glow discharge produces different ionization states mainly through the excitation of power supply in all of the frequency bands ranging from direct current to microwave. In this step, the glow discharge power of the RF generator is 75 W (a high frequency RF power), and the discharge continues for 3 sec. The fluxes of the reaction gases of silane and ammonia introduced into the reaction chamber are the same as those in the previous step. Namely, the fluxes of ammonia, silane, and nitrogen are 900 sccm, 40 sccm, 1000 sccm, respectively. The pressure in the reaction chamber is maintained at 8 Torr, and this state is maintained for 3 sec. In this way, by introducing high frequency power supply so that the reaction gas of silane ($SiH_4$) and ammonia ($NH_3$) are ionized or decomposed and the plasma is further developed, a thin film of silicon nitride is formed on the wafer surface. Usually, in non-equilibrium plasma, the electrons produced by glow discharge react with the reaction gases in a primary reaction, by which the reaction gases are decomposed into ions and active groups. Various active groups are transported by diffusion to the thin film growth surface (wafer surface) and the reaction chamber wall, and this process is accompanied with secondary reactions among the reactants. Then, the primary reactants and secondary reactants arriving at the thin film growth surface are adsorbed and react with the surface, and molecules in vapor phase are also released in this process, so that a thin film of silicon nitride is obtained. In this process, the time for depositing the thin film of silicon nitride is 3 sec. It is noted that, it is the complicated elementary reactions among the reaction gases in this step that result in that the resulting thin film of silicon nitride still comprises a large number of unstable unsaturated bonds (e.g. dangling bond Si—). This is also one of the reasons that lead to nonuniformity in the thin film of silicon nitride prepared by the current PECVD technique. Therefore, it is necessary in the present invention to perform further treatments on the resulting thin film of silicon nitride during subsequent steps, in order to convert the unsaturated bonds in the thin film which is unstable in the chemical state into stable saturated bonds.

Then, the RF generator is turned off, and the introduction of the gas mixture into the reaction chamber is stopped. At the same time, argon and nitrogen are introduced into the reaction chamber, the pressure value in the reaction chamber at this time is changed, and the pressure value in the reaction chamber at this time remains stable for a period of time in order to remove silane and ammonia remaining in the reaction chamber. In this step, the pressure in the reaction chamber is reduced from 8 Torr in the previous step to 6 Torr, this pressure is maintained for 30 sec, and silane and ammonia remaining in the reaction chamber are removed by introducing high-purity argon and nitrogen.

Argon and nitrogen are continuously introduced into the reaction chamber, the pressure value in the reaction chamber is kept constant, and the RF generator is turned on again. The duration of this step is 10 sec. The RF generator is turned on for 10 sec, and the glow discharge power of the RF generator is 50 W. The RF generator is turned off in 10 sec. At the same time, high-purity argon and nitrogen are introduced into the reaction chamber at fluxes of 10000 sccm respectively, and the pressure in the reaction chamber is maintained at 6 Torr. In this step, taking into account that argon itself has a relatively large weight, the introduced argon can be maintained over the formed thin film of silicon nitride and apply a certain pressure on the thin film of silicon nitride, so that the thin film of silicon nitride maintains a high density. The introduced nitrogen may release some N under excitation of the glow discharge to passivate dangling bonds Si— in surface of the thin film of silicon nitride. As a result, the deposited thin film of silicon nitride is passivated, so that unsaturated bonds in the thin film of silicon nitride are passivated into saturated bonds, which are chemically stable.

Then, it is continued that argon and nitrogen are introduced into the reaction chamber, and the pressure value in the reaction chamber is kept constant, so that silane and ammonia remaining in the reaction chamber are removed. In this step, to further remove the reaction gases (i.e., silane and ammonia) remaining in the reaction chamber, it is required to introduce into the reaction chamber high-purity argon and nitrogen, at the same time the pressure in the reaction chamber is regulated to maintain at 6 Torr, and this state is maintained for 10 sec.

At this time, the wafer is pushed upward and moved away from the showerhead blowing out the gas sources, the introduction of argon is stopped, the introduction of nitrogen into the reaction chamber is continued, the pressure value in the reaction chamber is kept constant, i.e., at 6 Torr, and this state is maintained for a period of time. In this step, the wafer with the thin film of silicon nitride deposited thereon is generally pushed upward with four ceramic posts, and is moved away from the showerhead for gas sources. While the introduction of argon (Ar) is stopped, it is further required to continue introduction of nitrogen into the reaction chamber at a flux of 1000 sccm.

Then, the reaction chamber is vacuated by a vacuum pump, so that the by-products in the depositing reaction are exhausted along with the introduced mainstream gases. In this step, for example, a valve value of 90 is selected and the throttle valve is completely opened. The gases in the reaction chamber are drawn by a pumping system like a vacuum pump, so that a vacuum state is developed in the reaction chamber, thus enabling absolute control on the pressure. At the same time, a Pump Through Final Valve is closed to prevent the gas mixture (including reaction gases of ammonia and silane) from flowing into the reaction chamber.

To further increase capacitance uniformity of the deposited thin film of silicon nitride, in an optional embodiment, before step S7 is performed, step S2-step S6 are repeated for several times as needed.

Furthermore, as a common practice in PECVD, during the above steps, the Remote Plasma System and the Remote plasma System Isolation Valve are closed; high frequency RF power (High Frequency RF1 Power) is used in step S3 and step S5, the RF Match Set 1 for the PECVD apparatus is selected as M4, and the low frequency RF power is always turned off.

Figure 2:
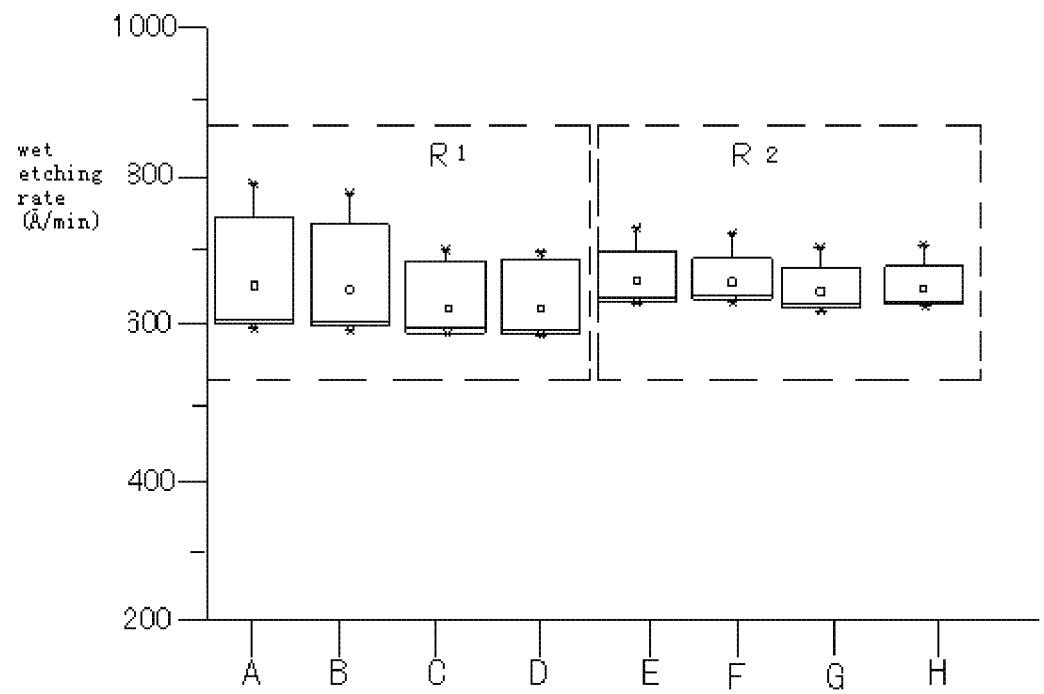
FIG. 2 is a schematic view showing a comparison between the etching rates sampled on the thin films in prior art and the present invention, respectively.

Generally, uniformity in the thin film of silicon nitride is characterized by wet etching rate of the thin film. FIG. 2 shows a comparison between the etching rates sampled on the thin films in prior art and in the present invention, respectively. Each block (A,B,C,D,E,F,G or H) in FIG. 2 represents the number of the thin film on the wafer, and the size of the block represents the distribution of etching rate of the thin film. As for the wet etching rate for the thin film of silicon nitride produced by the method for improving capacitance uniformity in the MIM device according to the present invention (in the dashed box $R_2$), the difference between the maximum etching rate and the minimum etching rate is very small, which indicates that the deposited thin film of silicon nitride has good uniformity. In contrast, as for the wet etching rate for the thin film of silicon nitride produced by the prior art method (in the dashed box $R_1$), the difference between the maximum etching rate and the minimum etching rate is significantly large, which indicates that the thin film of silicon nitride deposited by the prior art method has a poor uniformity.

It is noted that, since PECVD and similar deposition techniques are well known to those skilled in the art, for simplicity, all of the parameters for the thin film deposition apparatus are not set forth one by one in this application. It is by adopting the steps described above in the present invention that the deposition process itself as well as the resultant thin film have the advantages described below.

Figure 3:
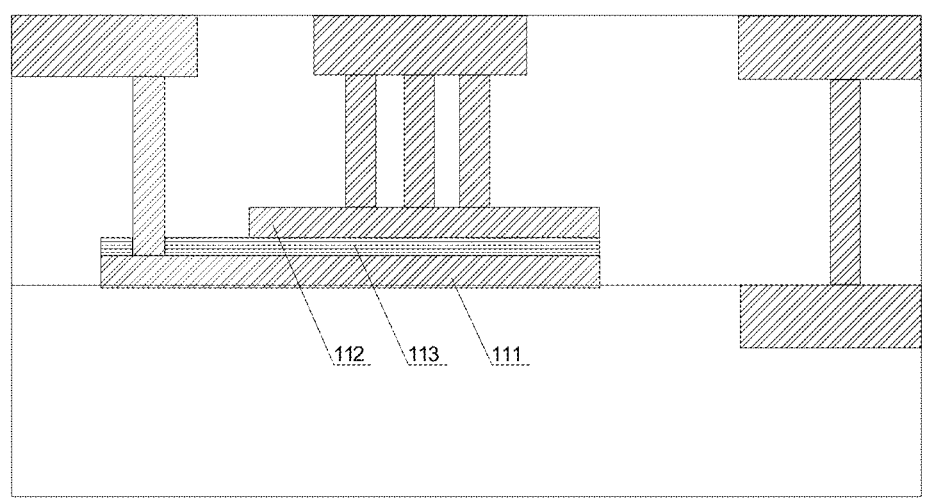
FIG. 3 is a cross-sectional view of a MIM device.

Since a single deposition step in the previous method is divided into several steps based on the current PECVD by means of several times of deposition/plasma processes, and the deposited surface is treated with a plasma after each deposition step is completed, some defects, unsaturated bonds, and the like which previously exist in the thin film are treated to a certain extent, so that uniformity in wet etching rate of the final thin film is greatly increased. Furthermore, uniformity in capacitance for the thin film in the MIM device is also increased. Referring to the cross-sectional view of the MIM device shown in FIG. 3, in an application of the above method, the dielectric layer 113 (i.e., a thin film of silicon nitride) between capacitor plate 111, 112 in a MIM device has an excellent capacitance uniformity.

It is noted that the above disclosure is only intended to exemplify the best embodiment of the present invention. It is understood that, what has not been described in details in this application can be carried out in the common manner in the art. In addition, as apparent to the skilled in the art, any equivalent changes and modifications to the present invention without departing from the spirit of the present invention should fall within the scope of the present invention.

The invention claimed is:

1. A method for improving capacitance uniformity in a MIM device, for the purpose of improving uniformity of a thin film within the MIM device, comprising:
   step S1: loading a wafer into a reaction chamber, introducing into the reaction chamber a gas mixture comprising silane and ammonia for producing the thin film, and maintaining the pressure value in the reaction chamber at this time for a period of time to stablize the reaction chamber;
   step S2: introducing said gas mixture into the reaction chamber at different fluxes, introducing nitrogen into the reaction chamber, and maintaining the pressure value in the reaction chamber at this time to be stablized for a period of time;
   step S3: turning on a RF generator to start a discharge to ionize or decompose the reaction gas in said gas mixture, so that a thin film of silicon nitride is formed on the surface of wafer by chemical vapor deposition;
   step S4: turning off the RF generator, stopping the introduction of the gas mixture into the reaction chamber, introducing argon and nitrogen into the reaction chamber at the same time, changing the pressure value in the reaction chamber at this time, and maintaining the pressure value in the reaction chamber at this time to be stablized for a period of time to remove silane and ammonia remaining in the reaction chamber;
   step S5: continuing to introduce argon and nitrogen into the reaction chamber, keeping the pressure value in the reaction chamber constant, and turning on the RF generator for passivating the deposited thin film of silicon nitride so that it has a stable chemical property;
   step S6: continuing to introduce argon and nitrogen into the reaction chamber, and keeping the pressure value in the reaction chamber constant, to remove silane and ammonia remaining in the reaction chamber;
   step S7: moving the wafer away from the position corresponding to a showerhead for gas sources, stopping introducing argon, continuing to introduce nitrogen into the reaction chamber, keeping the pressure value in the reaction chamber constant, and maintaining this state for a period of time; and
   step S8: vacuating the reaction chamber with a vacuum pump, so that the by-products in the depositing reaction are pumped out along with the mainstream gases.

2. The method as claimed in claim 1, wherein, in said step S1-step S6, the wafer is placed at a position where its upper surface is 0.3 inch from the showerhead for gas sources.

3. The method as claimed in claim 1, wherein, in step S1, the fluxes of silane and ammonia are 100 sccm, respectively, the flux of nitrogen is 2000 sccm, the pressure in the reaction chamber is maintained at 8 Torr, and this state is stablized for 10 sec.

4. The method as claimed in claim 1, wherein, in step S2, silane, ammonia are introduced into the reaction chamber at fluxes of 40 sccm, 900 sccm, respectively, nitrogen is introduced into the reaction chamber a flux of 1000 sccm, the pressure in the reaction chamber is maintained at 8 Torr, and this state is stablized for 30 sec.

5. The method as claimed in claim 1, wherein, in step S3, the glow discharge power of the RF generator is 75 W, the discharge continues for 3 sec, and the deposition time for the thin film of silicon nitride is 3 sec.

6. The method as claimed in claim 1, wherein, in step S4, argon and nitrogen are introduced into the reaction chamber at a flux of 10000 sccm, respectively.

7. The method as claimed in claim 1, wherein, in step S4, the pressure in the reaction chamber is maintained at 6 Torr to remove silane and ammonia remaining in the reaction chamber, and the time for removing is 30 sec.

8. The method as claimed in claim 1, wherein, in step S5, the introductions of argon and nitrogen into the reaction chamber are continued at a flux of 10000 sccm, respectively, so that the pressure in the reaction chamber is controlled at 6 Torr, the RF generator is turned on with a power of 50 W for 10 sec, and the time for passivating the thin film of silicon nitride is 10 sec.

9. The method as claimed in claim 1, wherein, in step S6, the introductions of argon and nitrogen into the reaction chamber are continued at a flux of 10000 sccm, respectively, the pressure in the reaction chamber is maintained at 6 Torr to remove silane and ammonia remaining in the reaction chamber, and the time for removing is 5 sec.

10. The method as claimed in claim 1, wherein, in step S7, the introduction of nitrogen into the reaction chamber is continued at a flux of 10000 sccm after closing argon, the pressure in the reaction chamber is maintained at 6 Torr, and this state is maintained for 5 sec.

11. The method as claimed in claim 1, wherein, in step S8, the reaction chamber is vacuated with a vacuum pump for 10 sec.

12. The method as claimed in claim 1, wherein, the method further comprising, before step S7 is performed, repeating step S2-step S6 for several times.

* * * * *